US010861721B2

(12) United States Patent
Chou et al.

(10) Patent No.: US 10,861,721 B2
(45) Date of Patent: Dec. 8, 2020

(54) APPARATUS AND METHOD FOR PROCESSING WAFER

(71) Applicant: TAIWAN SEMICONDUCTOR MANUFACTURING CO., LTD., Hsinchu (TW)

(72) Inventors: You-Hua Chou, Hsinchu (TW); Min-Hao Hong, Kaohsiung (TW); Kuan-Chung Chen, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/265,879

(22) Filed: Feb. 1, 2019

(65) Prior Publication Data

US 2019/0172735 A1 Jun. 6, 2019

Related U.S. Application Data

(63) Continuation of application No. 15/616,914, filed on Jun. 7, 2017, now Pat. No. 10,204,807.

(60) Provisional application No. 62/489,474, filed on Apr. 25, 2017.

(51) Int. Cl.

| | |
|---|---|
| *H01L 21/67* | (2006.01) |
| *H01L 21/687* | (2006.01) |
| *G03B 21/20* | (2006.01) |
| *H01L 33/08* | (2010.01) |
| *H01R 33/08* | (2006.01) |

(52) U.S. Cl.
CPC .. *H01L 21/67115* (2013.01); *H01L 21/67248* (2013.01); *H01L 21/68742* (2013.01); *G03B 21/20* (2013.01); *G03B 21/2006* (2013.01); *G03B 21/2046* (2013.01); *H01R 33/0854* (2013.01)

(58) Field of Classification Search
CPC ... H01L 21/67–68742; H01L 21/67115; H01L 21/67098; H01L 21/68742; G03B 21/20; G03B 21/2006; G03B 21/2046; G03B 21/2053; H01R 33/0836–089
See application file for complete search history.

(56) References Cited

U.S. PATENT DOCUMENTS

| | | | | |
|---|---|---|---|---|
| 5,258,808 | A * | 11/1993 | Watanuki | G03F 7/2032 355/89 |
| 5,908,239 | A * | 6/1999 | Sugimoto | B60Q 1/0683 362/421 |
| 6,092,299 | A * | 7/2000 | Yamazaki | H01L 21/67115 34/92 |
| 6,497,767 | B1 | 12/2002 | Okase et al. | |
| 2003/0119283 | A1 * | 6/2003 | Ishibashi | C23C 16/4412 438/478 |
| 2010/0307686 | A1 * | 12/2010 | Iizuka | H01L 21/67103 156/345.34 |

(Continued)

FOREIGN PATENT DOCUMENTS

| | | |
|---|---|---|
| CN | 103572211 A | 2/2014 |
| CN | 104205305 A | 12/2014 |

*Primary Examiner* — Sonya McCall-Shepard
(74) *Attorney, Agent, or Firm* — Maschoff Brennan

(57) ABSTRACT

A method includes delivering a wafer into a process chamber, applying a thermal energy to the wafer by a heat source, and moving the heat source substantially along a longitudinal direction of the heat source with respect to the wafer. An apparatus that performs the method is also disclosed.

20 Claims, 12 Drawing Sheets

(56) References Cited

U.S. PATENT DOCUMENTS

| | | |
|---|---|---|
| 2014/0041689 A1 | 2/2014 | Namba |
| 2014/0118751 A1* | 5/2014 | Rajagopalan ............ H01L 21/00 356/630 |
| 2015/0047677 A1* | 2/2015 | Muramoto ......... H01L 21/67051 134/19 |
| 2016/0111305 A1 | 4/2016 | Kumar et al. |

* cited by examiner

APPARATUS AND METHOD FOR PROCESSING WAFER

RELATED APPLICATIONS

This application is a continuation of U.S. patent application Ser. No. 15/616,914, filed on Jun. 7, 2017, now U.S. Pat. No. 10,204,807, issued on Feb. 12, 2019, which claims priority to U.S. Provisional Application No. 62/489,474, filed on Apr. 25, 2017, both of which are herein incorporated by reference in their entirety.

BACKGROUND

Manufacturing of an integrated circuit (IC) has been driven by increasing the density of the IC formed in a semiconductor device. This is accomplished by implementing more aggressive design rules to allow a larger density of the IC device to be formed. Nonetheless, the increased density of IC devices, such as transistors, has also increased the complexity of processing semiconductor devices with decreased feature sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
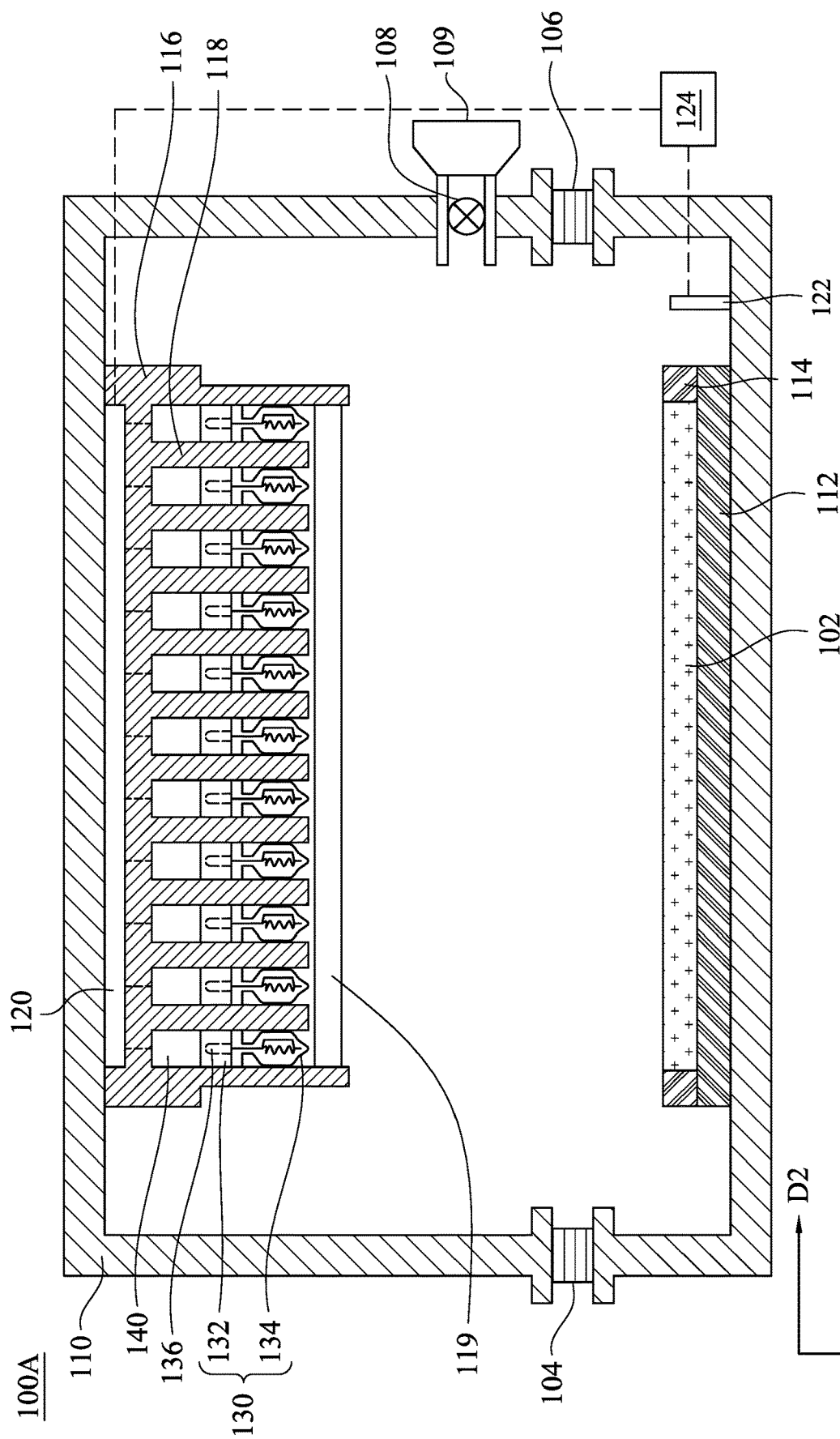
FIG. 1A is a side view of an apparatus for processing a wafer in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is made to FIG. 1A, which illustrates a side view of an apparatus 100A for processing a wafer 102 in accordance with some embodiments of the present disclosure. The apparatus 100A includes a gas-inlet port 104, a the gas-outlet port 106, a valve 108, a vacuum pump 109, a process chamber 110, a platen 112, a wafer support 114, a housing 116, a transparent plate 119, a circuit board 120, a temperature detector 122, a controller 124, plural heat sources 130, and plural movable devices 140. In some embodiments, the apparatus 100A is used for performing a thermal process (e.g. an anneal process) on the wafer 102.

The gas-inlet port 104, the gas-outlet port 106, the valve 108, and the vacuum pump 109 are connected to the process chamber 110. In some embodiments, the pressure within the process chamber 110 is reduced to a sub-atmospheric pressure prior to introducing a process gas through the gas-inlet port 104. In some embodiments, the process chamber 110 is evacuated by pumping through the gas-outlet port 106 by a combination of a valve 108 and a vacuum pump 109.

The platen 112 and the wafer support 114 are in the process chamber 110. The wafer support 114 is disposed on the platen 112 and configured to hold a wafer 102. In some embodiments, the wafer support 114 has an annular structure for holding edges of the wafer 102. In some embodiments, the platen 112 has a reflector plate for reflecting radiation.

The housing 116 and the transparent plate 119 are in the process chamber 110. The housing 116 is connected to the circuit board 120 which is in the process chamber 110. An array of the heat sources 130 are held in tubular stainless steel sleeves potted into the water cooled stainless steel housing 116. For example, the housing 116 has plural sleeves 118. The transparent plate 119 is connected to the housing 116 and disposed between the platen 112 and the sleeves 118. In some embodiments, the transparent plate 119 is disposed within the housing 116 and below the sleeves 118. In some embodiments, the transparent plate 119 is an optically transparent plate, such as a quartz plate, so as to serve as a quartz window. The temperature detector 122 is in the process chamber 110 and disposed near the wafer support 114 and is configured to detect the temperature near the wafer support 114 in the process chamber 110. The controller 124 is electrically coupled with the circuit board 120 and the temperature detector 122.

The heat sources 130 and the movable devices 140 are disposed in the sleeves 118 of the housing 116, in which the movable devices 140 contact and connect to the heat sources 130 respectively. In some embodiments, a vertical distance between the wafer 102 and at least one of the heat sources 130 is less than a vertical distance between the wafer 102 and the movable device 140 which is connected to this heat source 130. That is, at least one of the heat sources 130 is closer to the wafer 102 than the movable device 140 which is connected to this heat source 130.

In some embodiments, the housing 116 has a pressurized source and plural channels respectively disposed in the sleeves 118, in which the pressurized source is connected to the channels to introduce a thermally conductive gas, such as helium, into the channels, thereby cooling the heat sources 130 and the movable devices 140.

In some embodiments, at least one of the heat sources 130 and the corresponding movable device 140 which is connected to this heat source 130 are linearly arranged. For example, at least one of the heat sources 130 and the corresponding movable device 140 which is connected to this heat source 130 are arranged along a first direction D1. In some embodiments, the heat sources 130 are arranged along a second direction D2 to form an array, in which the first direction D1 and the second direction D2 are substantially perpendicular to each other.

The heat sources 130 are configured to provide thermal energy by radiation. In some embodiments, at least one of the heat sources 130 includes a lamp socket 132 and a lamp 134 having a plug 136. The lamp 134 is connected to the lamp socket 132 through inserting the plug 136 into the lamp socket 132. That is, the lamp 134 is partially embedded in the lamp socket 132. The lamp socket 132 and the lamp 134 are arranged along the first direction D1. In some embodiments, at least one of the lamps 134 is a halogen lamp, such as a tungsten halogen lamp, a quartz halogen lamp, or a quartz iodine lamp.

The heat sources 130 are electrically coupled with the circuit board 120 through the corresponding lamp sockets 132, and the lamps 134 are electrically drivable by the circuit board 120 to emit the radiation. That is, as the lamps 130 are driven, the lamps 134 are able to serve as heat providers, such that the heat sources 130 apply the thermal energy to the wafer 102 through the transparent plate 119.

The movable devices 140 are respectively connected to the corresponding heat sources 130 and are movable with respect to the wafer support 114. In some embodiments, at least one of the movable devices 140 is configured to put corresponding one of the heat sources 130 in motion, such as a rotational motion, a translational motion, or a combination thereof. In addition, the movable devices 140 are electrically coupled with the circuit board 120, and the movable devices 140 are electrically drivable by the circuit board 120. That is, as the movable devices 140 are driven, the movable devices 140 are able to put the corresponding heat sources 130 in the motion.

Figure 1B:
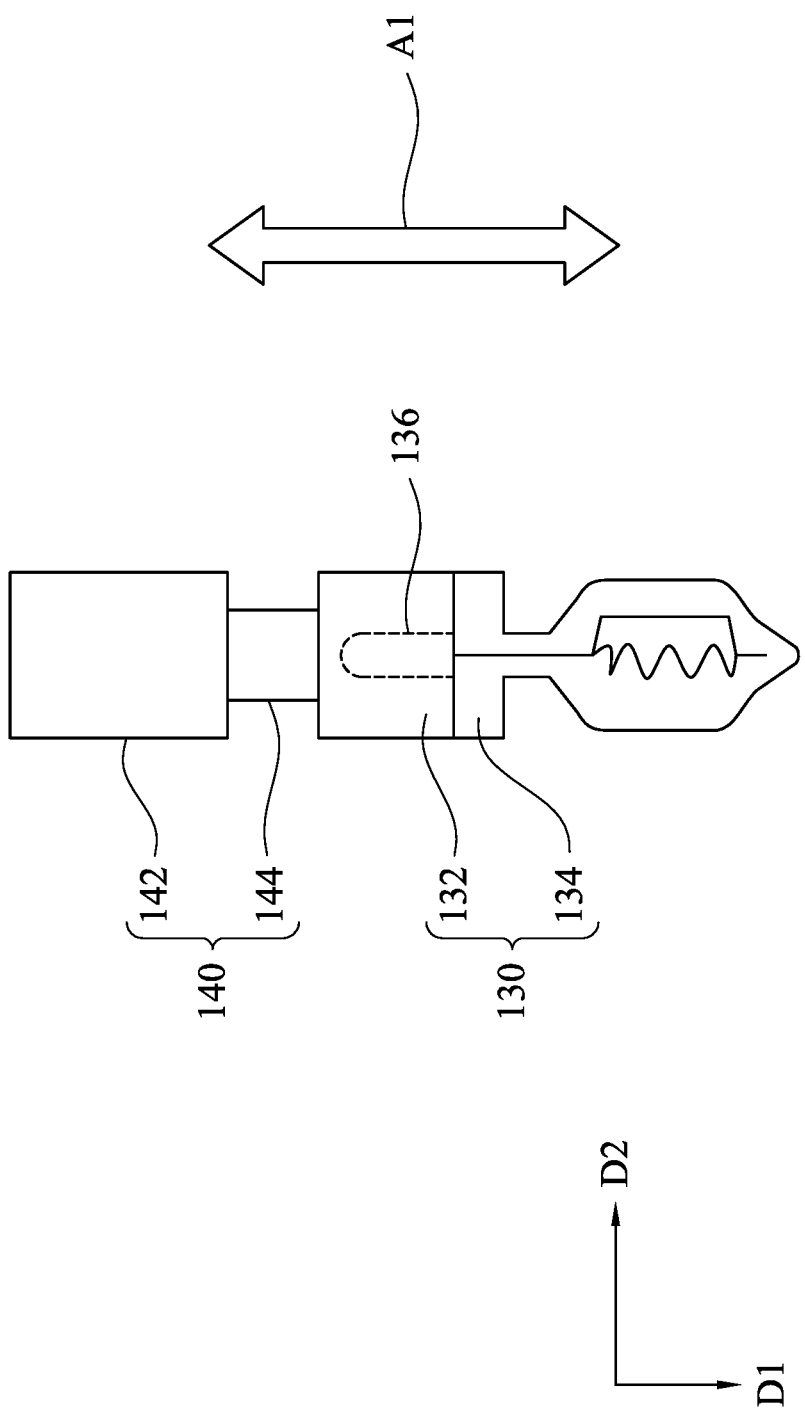
FIG. 1B is a combination of the heat source and the movable device illustrated in FIG. 1A.

Reference is made to FIG. 1B, which illustrates a combination of the heat source 130 and the movable device 140 illustrated in FIG. 1A. With respect to FIG. 1B, the first direction D1 and the second direction D2 illustrated in FIG. 1A are illustrated in FIG. 1B as well for ease of understanding. The movable device 140 includes a stator 142 and a lift pin 144 connected to the stator 142.

The lift pin 144 of the movable device 140 is in contact with the heat source 130 through contacting and connecting to the lamp socket 132. In some embodiments, the stator 142, the lift pin 144, the lamp socket 132, and the lamp 134 are arranged substantially in a line, and thus the lift pin 144 is disposed between the stator 142 and the lamp socket 132. For example, the stator 142, the lift pin 144, the lamp socket 132, and the lamp 134 are arranged along the first direction D1 in sequence. In addition, in a combination of the lamp socket 132, the lamp 134, the stator 142, and the lift pin 144, adjacent two of the components are in contact with each other. For example, two opposite ends of the lift pin 144 are respectively in contact with the stator 142 and an end surface of the the lamp socket 132.

The stator 142 is stationary with respect to the wafer support 114 (see FIG. 1A) and the lift pin 144 is movably received in the stator 142. That is, the stator 142 of the movable device 140 serves as a fixture stationary with respect to the wafer support 114 (see FIG. 1A), and the lift pin 144 is telescopically movable with respect to the fixture. In some embodiments, the movable device 140 is a step motor having a rod contacting the heat source 130. Specifically, the lift pin 144 serves as the rod of the step motor.

The heat source 130 is hung on the lift pin 144 of the movable device 140, and the bottom end of the lift pin 144, which is opposite to the stator 142, is connected to the lamp socket 132. Since the heat source 130 is in contact with the lift pin 144 through the lamp socket 132 which is in contact with to the lift pin 144, the heat source 130 is putted in a translational motion when the lift pin 144 moves. Explained in a different way, the heat source 130 is putted in a translational motion along the first direction D1 or the direction which is reversed to the first direction D1 by the lift pin 144, such that the heat source 130 is able to move along a line A1. That is, the movable device 140 can serve as an actuator which abutting the heat source 130 through the lift pin 144. Therefore, the position of the heat source 130 is adjustable.

Reference is made back to FIG. 1A. The movable devices 140 respectively abut the heat providers 130, and the position of at least one of the heat sources 130 is adjustable. Therefore, a vertical distance between the wafer 102 and the lamp 134 of at least one of the heat sources 130 is adjustable as well. That is, the heat sources 130 are movable with respect to the platen 112 or the wafer support 114 and are movable with respect to the wafer 102 as well.

In some embodiments, as the lamp 134 of at least one of the heat sources 130 is lifted by the corresponding movable device 140, a vertical distance between the wafer 102 and the lamp 134 increases. Accordingly, due to the increase of the vertical distance between the wafer 102 and the lamp 134, the thermal flux received by the wafer 102 from the lamp 134 decreases, thereby slowing down the raise of temperature of the wafer 102 as well.

In some embodiments, as the lamp 134 of at least one of the heat sources 130 is lowered by the corresponding movable device 140, a vertical distance between the wafer 102 and the lamp 134 decreases. Accordingly, due to the decrease of the vertical distance between the wafer 102 and the lamp 134, the thermal flux received by the wafer 102 from the lamp 134 increases, thereby speeding up the temperature of the wafer 102 as well.

In some embodiments, the operation of the heat sources 130 and the movable devices 140 are driven by the controller 124 through the circuit board 120. For example, a user can operate the controller 124 to control the parameters of the heat sources 130 and the movable devices 140, such as height, power, temperature, or combinations thereof. In some embodiments, the movable devices 140 are independently driven, and thus the heat sources 130 may have different height from the wafer 102.

Furthermore, in some embodiments, the controller 124 is configured to receive temperature information and transmit a driving signal to the circuit board 120, in which the temperature information is obtained from the temperature detector 122. In some embodiments, as the controller 124 receives temperature information from the temperature detector 122, once the temperature value detected by the temperature detector 122 is greater than a predetermined temperature value, it represents that the temperature of the wafer 102 may be greater than an expectation value. Accordingly, once the temperature value detected by the temperature detector 122 is greater than the predetermined temperature value, the controller 124 will transmit a driving signal to the circuit board 120, so as to drive at least one of the movable devices 140. Then, at least one of the heat sources 130 is lifted, such that the thermal flux received by the wafer 102 from the lamp 134 decreases. Therefore, due to the decrease of the thermal flux received by the wafer 102, the raise of temperature of the wafer 102 is slowed down.

In some embodiments, as the controller 124 receives temperature information from the temperature detector 122, once the temperature value detected by the temperature detector 122 is lower than the predetermined temperature value, it represents that the temperature of the wafer 102 may be lower than an expectation value. Accordingly, once the temperature value detected by the temperature detector 122 is lower than the predetermined temperature value, the controller 124 will transmit a driving signal to the circuit board 120, so as to drive at least one of the movable devices 140. Then, at least one of the heat sources 130 is moved downward, such that the thermal flux received by the wafer 102 from the lamp 134 increases. Therefore, due to the increase of the thermal flux received by the wafer 102, the raise of temperature of the wafer 102 is speeded up.

Figure 1C:
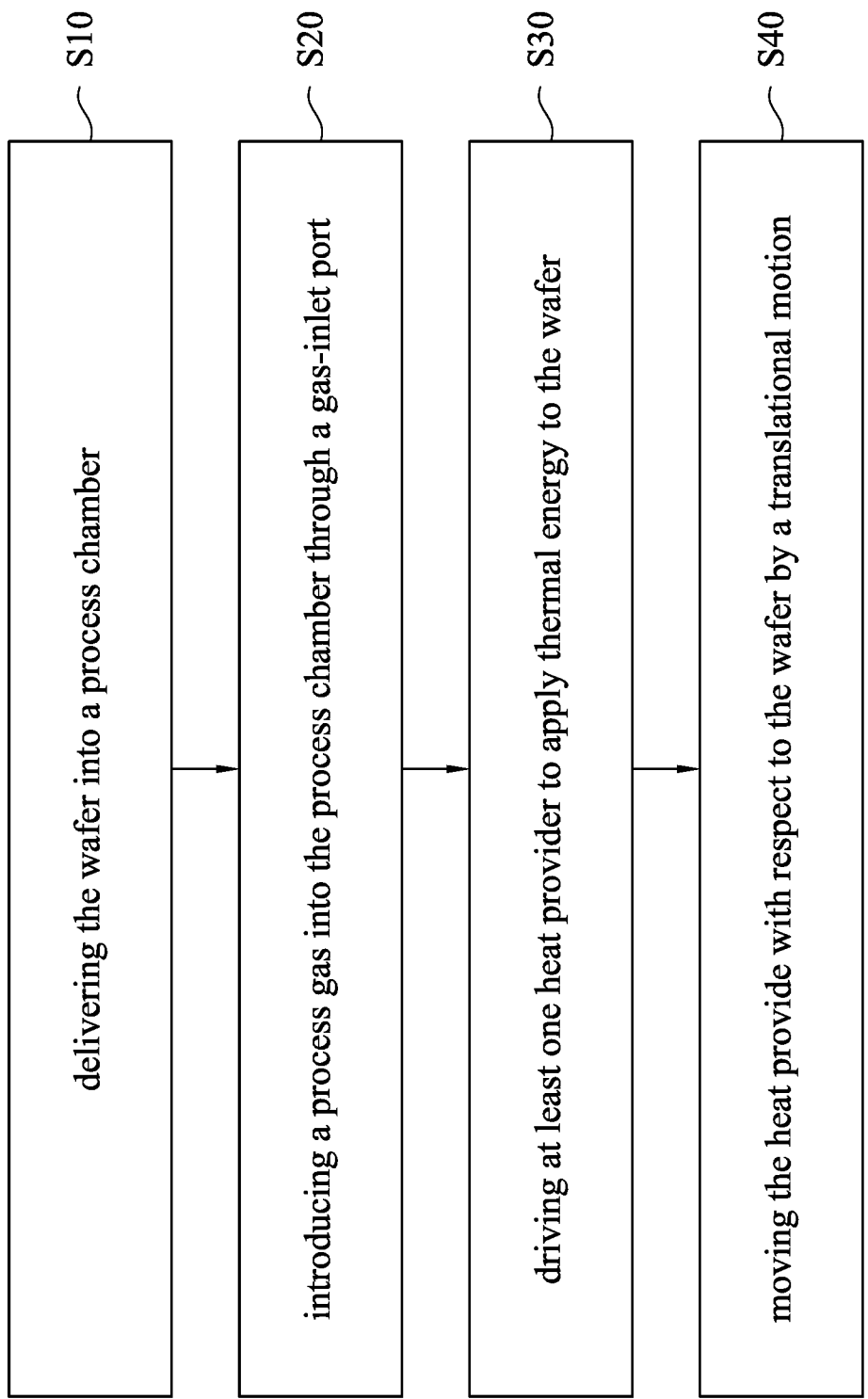
FIG. 1C is a flowchart of operations of a method for processing a wafer in accordance with some embodiments of the present disclosure.

Reference is made to FIG. 1C, which illustrates a flowchart of operations S10-S40 of a method for processing a wafer in accordance with some embodiments of the present disclosure. In some embodiments, the apparatus 100A is used for heating a wafer, so as to perform an annealing process on the wafer. The method begins with operation S10 that delivering the wafer into a process chamber. The method continues with operation S20 that introducing a process gas into the process chamber through a gas-inlet port. The method continues with operation S30 that driving at least one heat provider to apply thermal energy to the wafer. The method continues with operation S40 that moving the heat provide with respect to the wafer by a translational motion. In some embodiments, in the operation S40, the translational motion of the heat provider is caused by at least one moveable device. In some embodiments, in the operation S40, a distance between the wafer and the heat provider is adjusted, so as to slow down or speed up the raise of temperature of the wafer. For, example, as the heat provider is lifted with respect to the wafer by the movable device, the raise of temperature of the wafer is slowed down. Alternatively, as the heat provider is moved downward with respect to the wafer by the movable device, the raise of temperature of the wafer is speeded up.

Figure 2A:
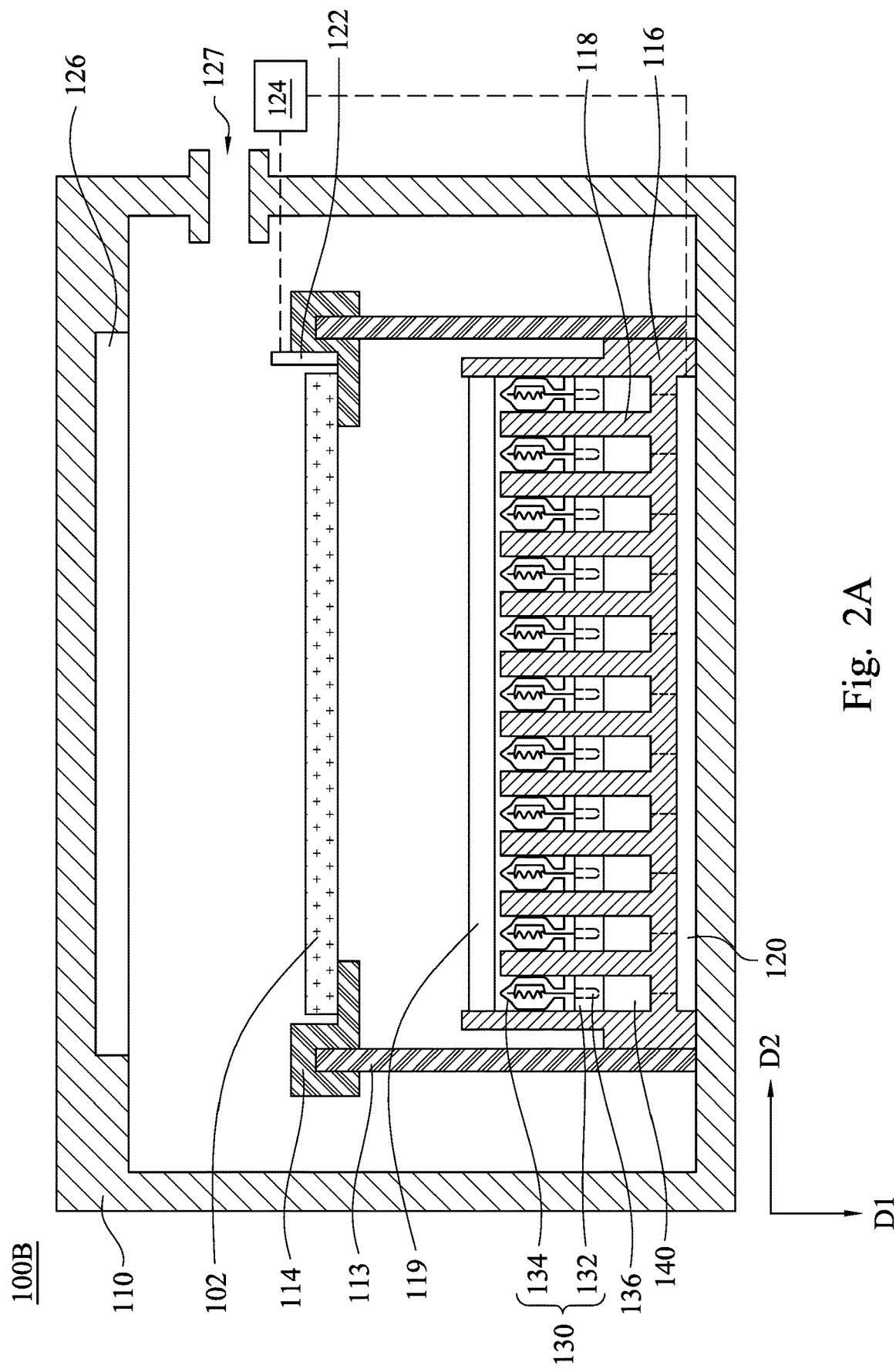
FIG. 2A is a side view of an apparatus for processing a wafer in accordance with some embodiments of the present disclosure.

Reference is made to FIG. 2A, in which FIG. 2A is a side view of an apparatus 100B for processing a wafer in accordance with some embodiments of the present disclosure. As illustrated in FIGS. 1A and 2A, the lamps 134 of the apparatus 100A illustrated in FIG. 1A downward emit the radiation, and lamps 134 of the apparatus 100B illustrated in FIG. 2A upward illuminate the radiation.

As shown in FIG. 2A, the apparatus 100B includes a process chamber 110, a annular extension 113, a wafer support 114, a housing 116, a transparent plate 119, a circuit board 120, a temperature detector 122, a controller 124, a reflection plate 126, an access port 127, plural heat sources 130, and plural movable devices 140. In some embodiments, the apparatus 100B is used for performing a thermal process (e.g. an annealing process) on the wafer 102. Details regarding the apparatus 100B illustrated in FIG. 2A and similar to the apparatus 100A illustrated in FIG. 1A are not repeated herein.

The annular extension 113 and the wafer support 114 are in the process chamber 110. In some embodiments, the wafer support 114 is disposed on the annular extension 113, and a wafer 102 is supported by the wafer support 114. In some embodiments, the wafer support 114 has an annular structure for supporting edges of the wafer 102, and the wafer support 114 is a thermal conductor which is in contact with the wafer 102. The wafer support 114 is between the housing 116 and the reflection plate 126, in which the reflection plate 126 has a reflection surface facing the wafer 102. The access port 127 is connected to the process chamber 110 to facilitate entry and egress of the wafer 102. In some embodiments, the access port 127 is coupled to a transfer chamber (not illustrated) or a load lock chamber (not illustrated) and may be selectively sealed with a valve, such as a slit valve (not illustrated).

The heat sources 130 and the movable devices 140 are disposed in the sleeves 118 of the housing 116. In some embodiments, the wafer support 114 is between the reflection plate 126 and at least one of the heat sources 130 and the movable devices 140. In some embodiments, at least one of the heat sources 130 and the corresponding movable device 140 which is connected to this heat source 130 are arranged along a first direction D1. In some embodiments, the heat sources 130 are arranged along a second direction D2 to form an array, in which the first direction D1 and the second direction D2 are substantially perpendicular to each other.

The heat sources 130 are configured to provide thermal energy by radiation. In some embodiments, at least one of the heat sources 130 includes a lamp socket 132 and a lamp 134 having a plug 136, in which the lamp 134 is connected to the lamp socket 132 through inserting the plug 136 into the lamp socket 132, and the lamp socket 132 and the lamp 134 are arranged along the first direction D1. In the apparatus 100B illustrated in FIG. 2A, as the lamps 134 are driven by the circuit board 120, the lamps 134 emit the radiation toward the platen 112 and the reflection plate 126. In some embodiments, the platen 112 absorbs the radiation and therefore the temperature of the platen 112 increases. Since the platen 112 is the thermal conductor, as the temperature of the platen 112 is greater than that of the wafer 102, the platen 112 increases the temperature of the wafer 102. In some embodiments, the radiation reaching the reflection plate 126 are reflected from the reflection surface of the reflection plate 126 toward the wafer 102, thereby increasing the temperature of the wafer 102 due to the radiation.

Figure 2B:
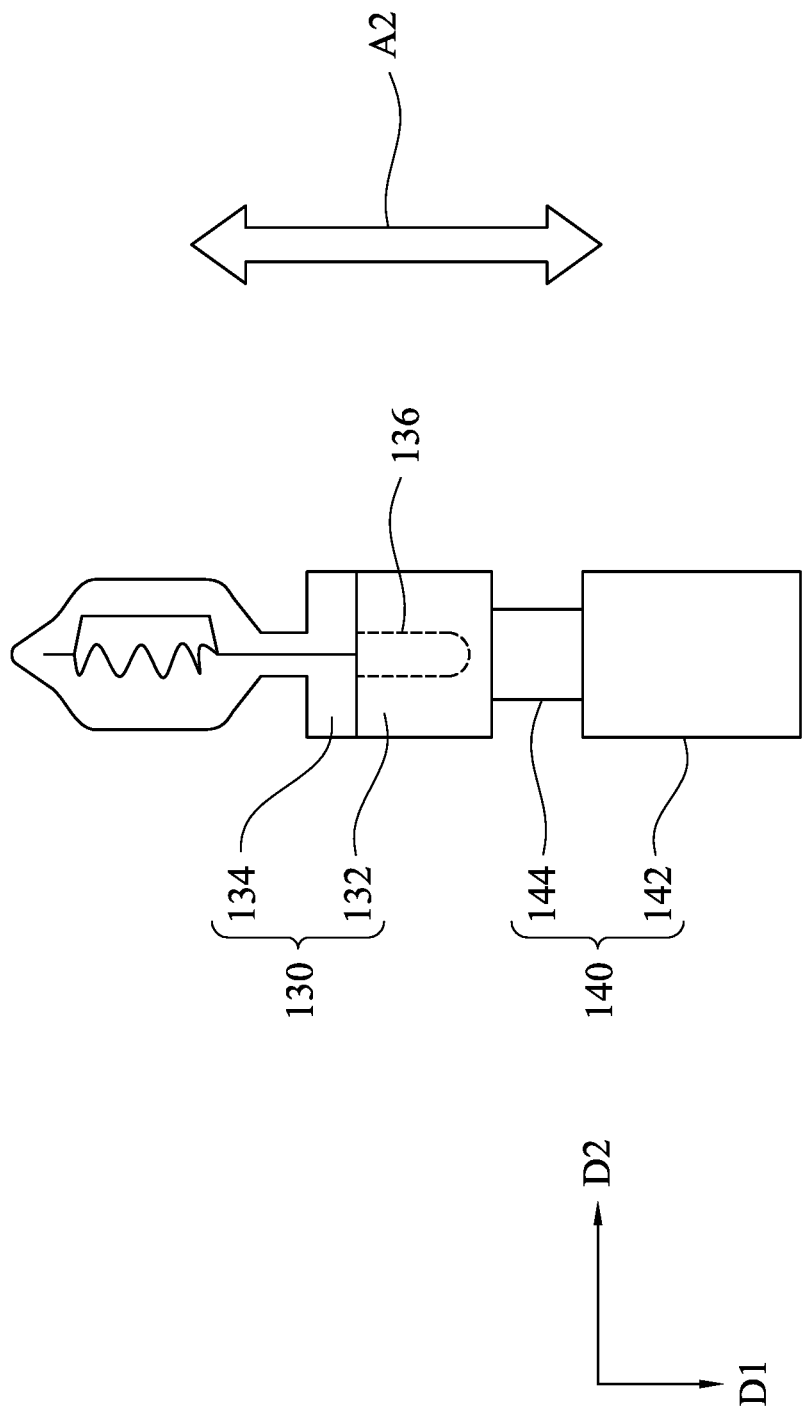
FIG. 2B is a combination of the heat source and the movable device illustrated in FIG. 2A.

Reference is made to FIG. 2B, in which FIG. 2B is a combination of the heat source 130 and the movable device 140 illustrated in FIG. 2A. With respect to FIG. 2B, the first direction D1 and the second direction D2 illustrated in FIG. 2A are illustrated in FIG. 2B as well for ease of understanding. The movable device 140 includes an stator 142 and a lift pin 144 connected to the stator 142, in which the lamp 134, the lamp socket 132, the stator 142, and the lift pin 144 are arranged substantially in a line along the first direction D1 in sequence. In addition, in a combination of the lamp socket 132, the lamp 134, the stator 142, and the lift pin 144, adjacent two of the components are in contact with each other.

The stator 142 is stationary with respect to the wafer support 114 (see FIG. 2A) and the lift pin 144 is telescopically movably received in the stator 142. Therefore, the heat source 130 is able to move along a line A2, and the position of the heat source 130 is adjustable.

Reference is made back to FIG. 2A. The movable devices 140 are respectively abut the heat providers 130, and the position of at least one of the heat sources 130 is adjustable. Therefore, since the position of at least one of the heat sources 130 is adjustable, a vertical distance between the wafer 102 and the lamp 134 of at least one of the heat sources 130 is adjustable as well.

In some embodiments, as the lamp 134 of at least one of the heat sources 130 is lifted by the corresponding movable device 140, a vertical distance between the platen 112 and the lamp 134 decreases. Accordingly, due to the decrease of the vertical distance between the platen 112 and the lamp 134, the thermal flux received by the platen 112 from the lamp 134 increases, thereby speeding up the raise of temperature of the wafer 102 and the platen 112. Furthermore, as the lamp 134 of at least one of the heat sources 130 is lifted by the corresponding movable device 140, a vertical distance between the reflection plate 126 and the lamp 134 decreases. Accordingly, due to the decrease of the vertical distance between the reflection plate 126 and the lamp 134, radiation reflected from the reflection plate 126 increases, thereby speeding up the raise of temperature of the wafer 102 as well.

In some embodiments, as the lamp 134 of at least one of the heat sources 130 is moved downward by the corresponding movable device 140, a vertical distance between the platen 112 and the lamp 134 increases. Accordingly, due to the increase of the vertical distance between the platen 112 and the lamp 134, the thermal flux received by the platen 112 from the lamp 134 decreases, thereby slowing down the raise of temperature of the wafer 102 and the platen 112. Furthermore, as the lamp 134 of at least one of the heat sources 130 is moved downward by the corresponding movable device 140, a vertical distance between the reflection plate 126 and the lamp 134 is adjusted to increase. Accordingly, due to the increase of the vertical distance between the reflection plate 126 and the lamp 134, the radiation reflected from the reflection plate 126 decreases, thereby slowing down the raise of temperature of the wafer 102.

Figure 2C:
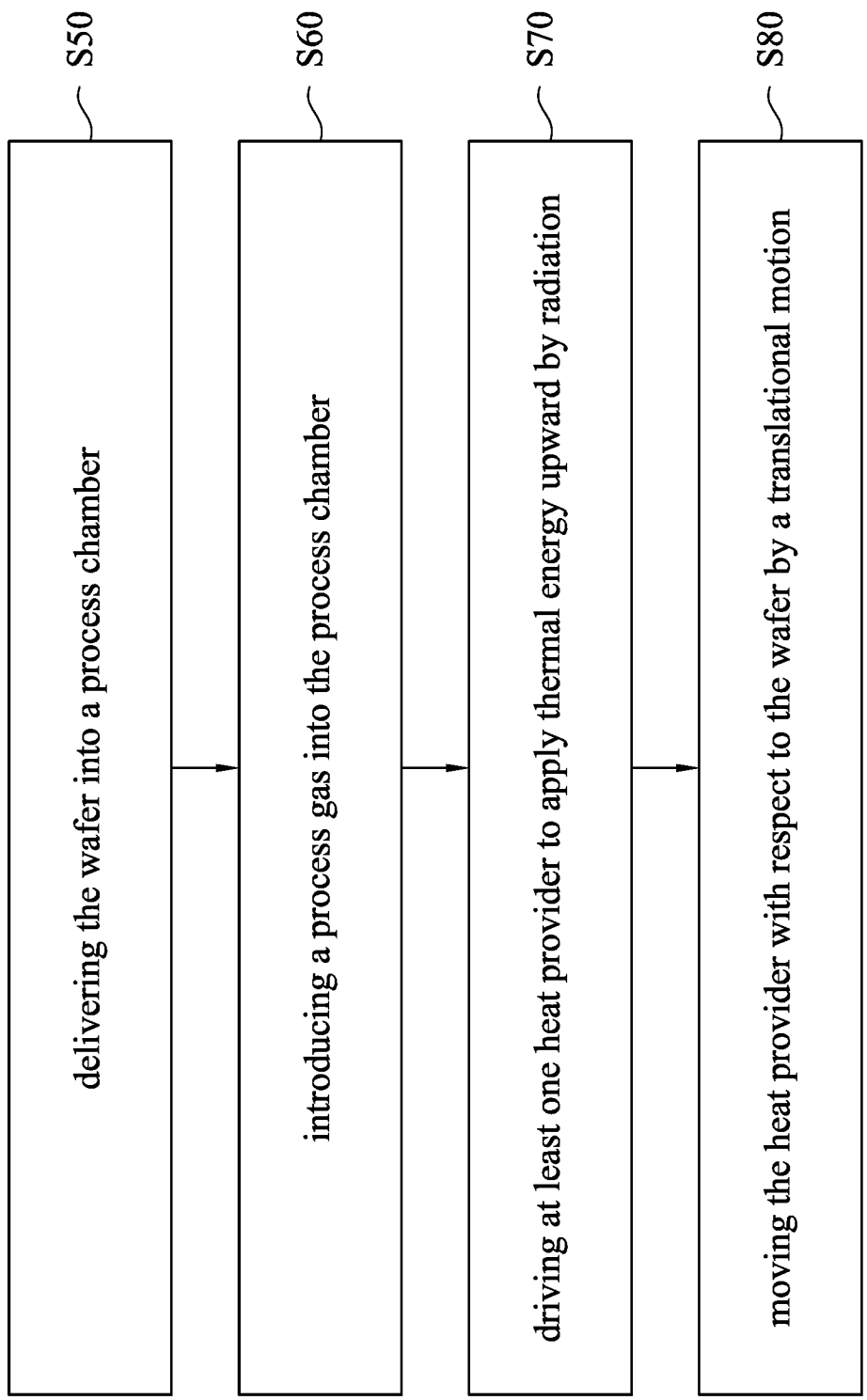
FIG. 2C is a flowchart of operations of a method for processing a wafer in accordance with some embodiments of the present disclosure.

Reference is made to FIG. 2C, which illustrates a flowchart of operations S50-S80 of a method for processing a wafer in accordance with some embodiments of the present disclosure. In some embodiments, the apparatus 100B is used for heating a wafer, so as to perform an annealing process on the wafer. The method begins with operation S50 that delivering the wafer into a process chamber. The method continues with operation S60 that introducing a process gas into the process chamber. The method continues with operation S70 that driving at least one heat provider to apply thermal energy upward by radiation. The method continues with operation S80 that moving the heat provider with respect to the wafer by a translational motion. In some embodiments, in the operation S50, the wafer is delivered into the process chamber through an access port. In some embodiments, in the operation S50, the process gas is introduced into the process chamber through an access port. In some embodiments, in the operation S80, the translational motion of the heat provider is caused by at least one movable device. In some embodiments, in the operation S80, a distance between the wafer and the heat provider is adjusted, so as to slow down or speed up the raise of temperature of the wafer. For, example, as the heat provider is lifted with respect to the wafer by the movable device, the raise of temperature of the wafer is speeded up. Alternatively, as the heat provider is moved downward with respect to the wafer by the movable device, the raise of temperature of the wafer is slowed down.

Figure 3:
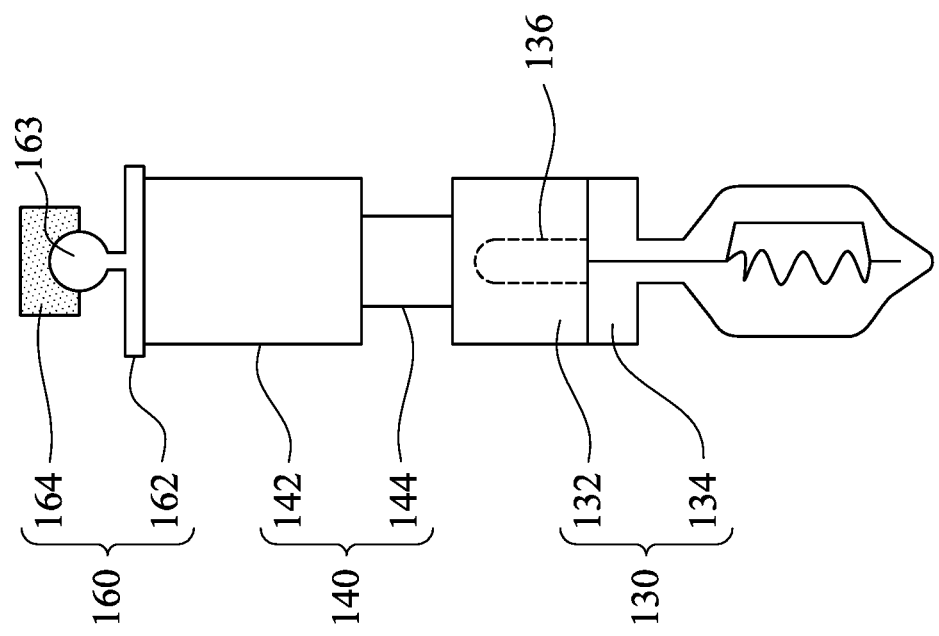
FIG. 3 is a side view of a combination of a heat source, a movable device, and a spherical joint of an apparatus for processing a wafer in accordance with some embodiments of the present disclosure.

Reference is made to FIG. 3, in which FIG. 3 is a side view of a combination of a heat source 130, a movable device 140, and a spherical joint 160 in accordance with some embodiments of the present disclosure. As illustrated in FIG. 3, the apparatus may further include a spherical joint 160 connected to the movable device 140. The spherical joint 160 includes a connecting element 162 and a ball socket 164. The connecting element 162 has a ball-shaped end 163 in the ball socket 164. The spherical joint 160 allows the movable device 140 to swing in more than two planes. That is, with the spherical joint 160, the heat source 130 and the movable device 140 are able to be slanted from a vertical direction. Since the heat source 130 can be slanted from the vertical direction, the area and distribution of the radiation provided by the heat source 130 on a wafer are adjustable.

Figure 4A:
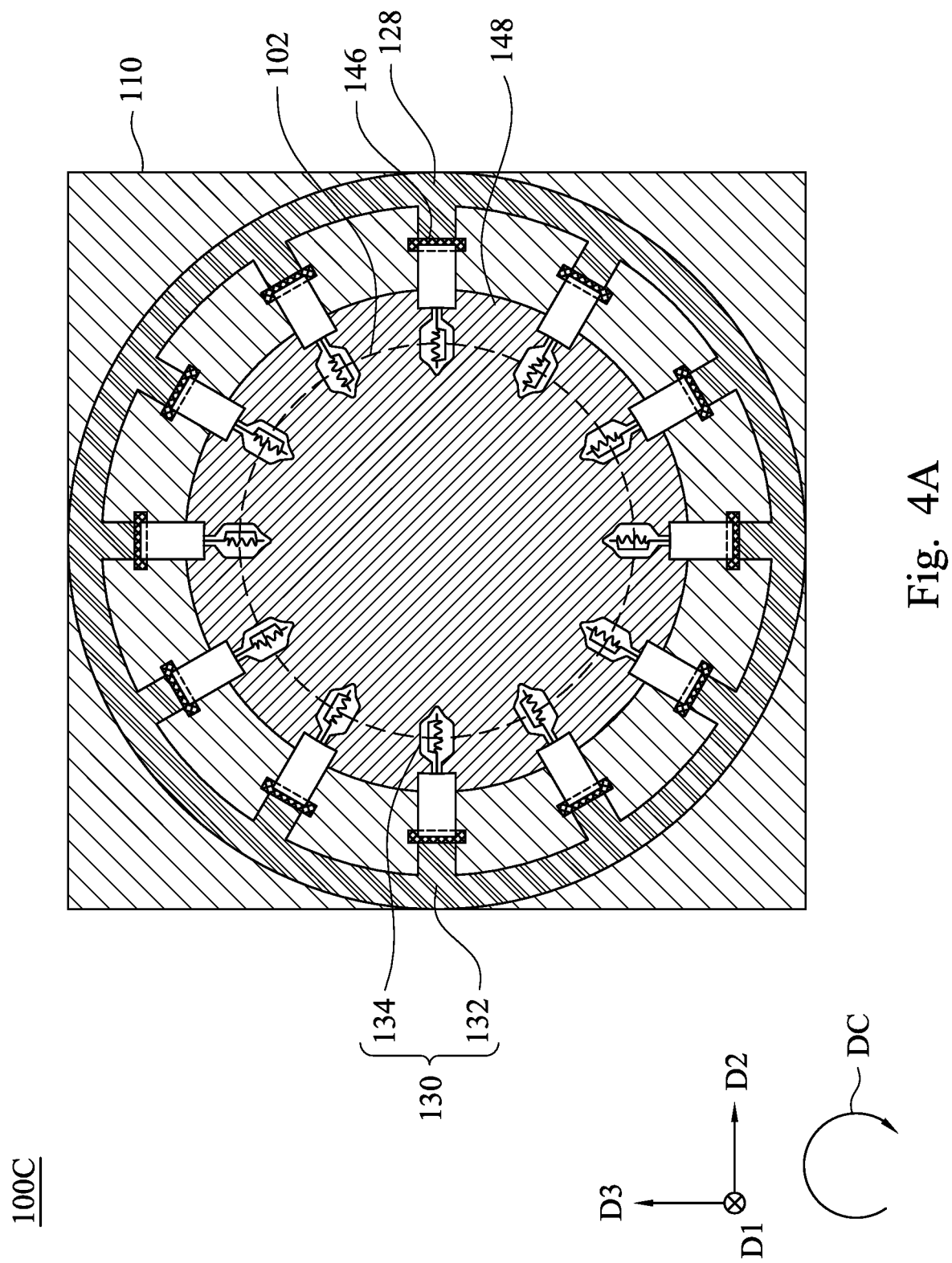
FIG. 4A is a top view of an apparatus for processing a wafer in accordance with some embodiments of the present disclosure.
Figure 4B:
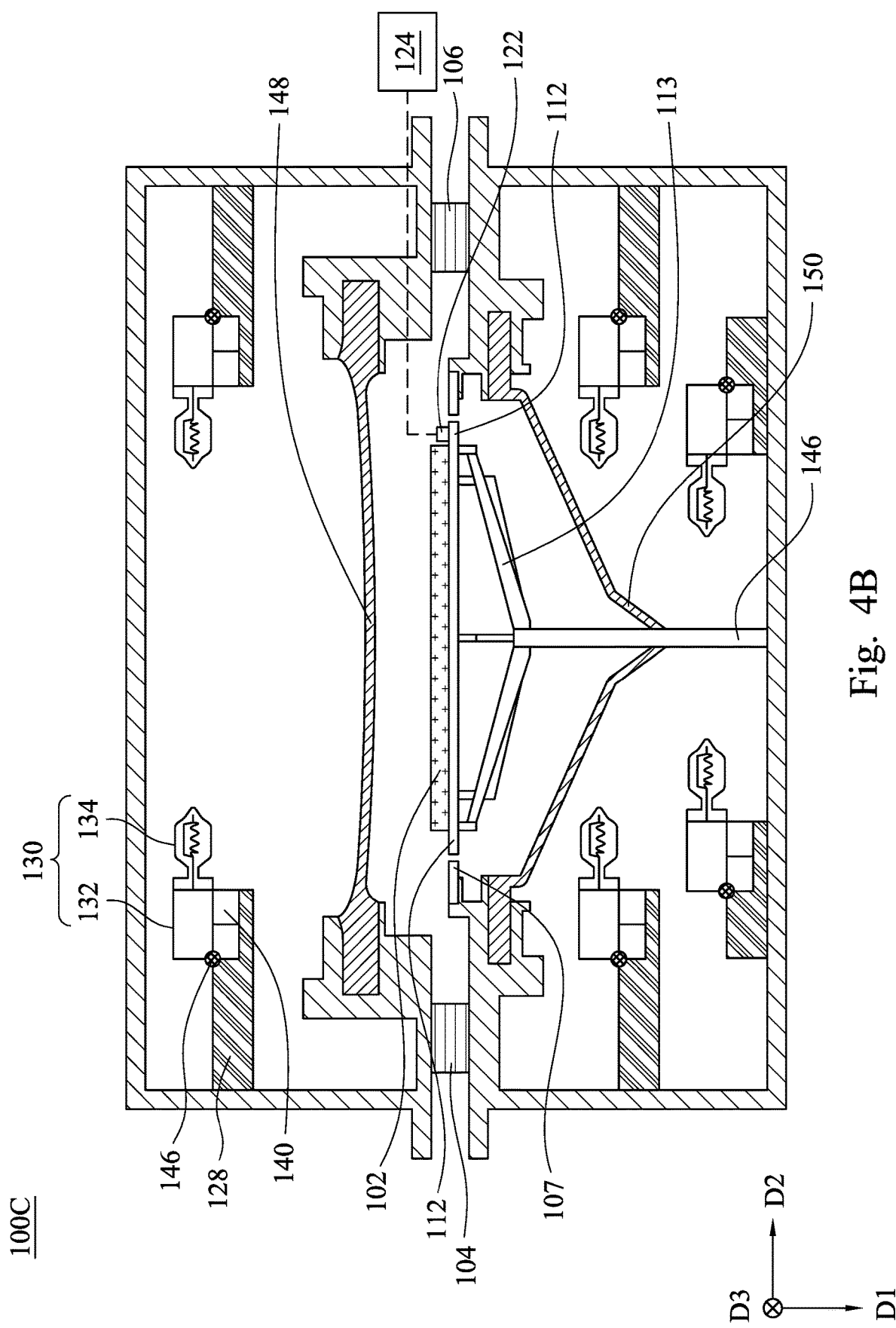
FIG. 4B is a side view of the apparatus for processing a wafer illustrated in FIG. 4A.

Reference is made to FIGS. 4A and 4B, in which FIG. 4A is a top view of an apparatus 100C for processing a wafer 102 in accordance with some embodiments of the present disclosure, and FIG. 4B is a side view of the apparatus 100C illustrated in FIG. 4A. At least one of movable devices 140 of the apparatus 100C is configured to rotate corresponding one of heat sources 130 of the apparatus 100C.

The apparatus 100C includes a gas-inlet port 104, a gas-outlet port 106, a preheat ring 107, a process chamber 110, a platen support 111, a platen 112, a temperature detector 122, a controller 124, plural frames 128, plural heat sources 130, plural movable devices 140, plural pivots 146, an upper dome 148, and a lower dome 150. In some embodiments, the apparatus 100C is used for performing a thermal process on (e.g. an epitaxy process) the wafer 102. Details regarding the apparatus 100C illustrated in FIG. 4A or 4B and similar to the apparatus 100A illustrated in FIG. 1A are not repeated herein.

The gas-inlet port 104 and the gas-outlet port 106 are connected to the process chamber 110. In some embodiments, the gas-inlet port 104 adapted to provide a process gas therethrough into the process chamber 110, while the gas-outlet port 106 is adapted to exhaust the process gas from the process chamber 110. Therefore, a laminar flow can pass over an upper surface of a wafer 102 in a processing position. Furthermore, the preheat ring 107 is removably disposed in the process chamber 110 and near the gas-inlet port 104. The preheat ring 107 is disposed around the internal volume of the process chamber 110 and circumscribes the wafer 102 while the wafer 102 is in the processing position. During processing, the preheat ring 107 is heated, and the preheat ring 107 facilitates preheating of a process gas as the process gas enters the process chamber 110 through the gas-inlet port 104.

The platen support 111 and the platen 112 are in the process chamber 110, in which the platen 112 is supported by the platen support 111. In some embodiments, the platen support 111 is formed from an optically transparent material, such as quartz. The platen 112 is configured to receive and support the wafer 102. In some embodiments, the platen 112 is formed from silicon carbide or graphite coated with silicon carbide. In some embodiments, the platen support 111 is rotatable in order to facilitate the rotation of the wafer 102 during processing. For example, as an epitaxial process is performed, the platen 112 supported by the platen support 111 receives and supports the wafer 102 to be epitaxially coated, and then the platen support 111 facilitates the rotation of the wafer 102. The frames 128 are in the process chamber 110 and connected to inner wall and bottom of the process chamber 110. In some embodiments, the frames 128 are ring-shaped.

The heat sources 130 and the movable devices 140 are in the process chamber 110. The movable devices 140 are respectively supported by the frames 128, and the heat sources 130 are respectively in contact with and connected to the movable devices 140. In some embodiments, the platen 112 is between the wafer 102 and a first group of the heat sources 130. In some embodiments, the wafer 102 is between the platen 112 and a second group of the heat sources 130. That, the first group of the heat sources 130 are disposed near the bottom of the process chamber 110 and the second group of the heat sources 130 are disposed near a top of the process chamber 110, while the wafer 102 is at the middle part of the process chamber 110.

In some embodiments, at least one of the heat sources 130 and the corresponding movable device 140 which is connected to the same heat source 130 are arranged along a first direction D1. In some embodiments, the heat sources 130 are arranged along a curved line. For example, the heat sources 130 are along a circular direction DC to form a circular array, in which the first direction D1 and the circular direction DC are substantially perpendicular to each other. In some embodiments, the apparatus 100C has a plurality of the circular arrays, in which some of the circular arrays are near the bottom of the process chamber 110 and others of the circular arrays are near the top of the process chamber 110.

The heat sources 130 are configured to emit thermal energy by radiation, in which some of the heat sources 130 upward emit the radiation and others of the heat sources 130 downward emit the radiation. In some embodiments, at least one of the heat sources 130 includes a lamp socket 132 and a lamp 134 having a plug 136. The lamp 134 is connected to the lamp socket 132 through inserting the plug 136 into the lamp socket 132, and the lamp socket 132 and the lamp 134 are arranged along a second direction D2, in which the first direction D1 and the second direction D2 are substantially perpendicular to each other. Furthermore, the pivots 146 respectively connected to and fixed to the frames 128 and the lamp socket 132 of the heat sources 130. In some embodiments, the heat sources 130 are used for an epitaxial process. For example, during an epitaxial process, a process gas is introduced into the process chamber 110 through the gas-inlet port 104, and then thermal decomposition of the process gas onto the wafer 102 is facilitated by the heat sources 130, thereby forming an epitaxial layer on the wafer 102.

Figure 4C:
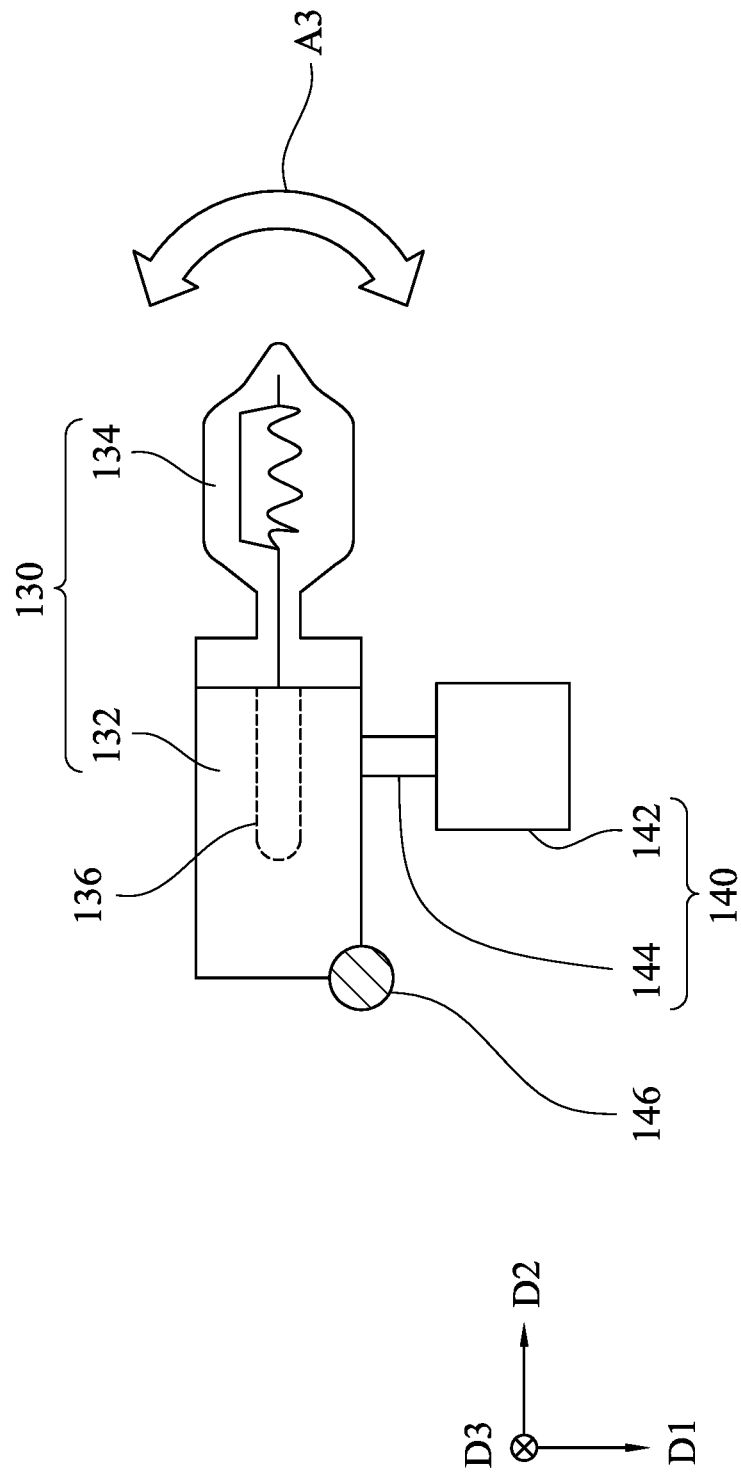
FIG. 4C is a combination of the heat source, the movable device, and the rotatable shaft illustrated in FIG. 4B.

Reference is made to FIG. 4C, which illustrates a combination of the heat source 130, the movable device 140, and the pivot 146 illustrated in FIG. 4B. With respect to FIG. 4C, the first direction D1 and the second direction D2 illustrated in FIGS. 4A and 4B are illustrated in FIG. 4C as well for ease of understanding. The movable device 140 includes a stator 142 and a lift pin 144. The lift pin 144 of the movable device 140 is in contact with and connected to the heat source 130 through the lamp socket 132, in which the lift pin 144 is in contact with a side surface of the lamp socket 132. In some embodiments, the lamp socket 132, the lift pin 144, and the stator 142 are arranged substantially in a line in sequence, and thus the lift pin 144 is disposed between the lamp socket 132 and the stator 142. For example, the lamp socket 132, the lift pin 144, and the stator 142 are arranged along the first direction D1 in sequence.

The stator 142 is stationary with respect to the wafer support 114 (see FIG. 4A) and the lift pin 144 is telescopically movably received in the stator 142. In addition, in some embodiments, as the lift pin 144 is driven to move with respect to the stator 142, the position of the stator 142 is fixed.

The lift pin 144 is between the pivot 146 and the lamp 134, and the pivot 146 extends along a third direction D3, in which the third direction D3 is substantially perpendicular to the first direction D1 and the second direction D2. That is, an axial direction of the pivot 146 is substantially perpendicular to the first direction D1. Moreover, as the lift pin 144 is an output shaft of a step motor, the output shaft of the step motor and the pivot 146 have different axial directions. Specifically, the output shaft of the step motor and the pivot 146 have axial directions substantially perpendicular to each other.

Since the heat source 130 is connected to the pivot 146 through the lamp socket 132, the heat source 130 is putted in a rotational motion when the lift pin 144 moves upward. Explained in a different way, the heat source 130 is putted in the rotational motion about the pivot 146. As the lift pin 144 moves to push the heat source 130, the heat source 130 is able to rotate along a curved line A3, and hence the heat source 130 can be putted in a clockwise rotation or a counterclockwise rotation. Therefore, lamp socket 132 of the heat source 130 is rotatable with respect to the pivot 146.

The upper dome 148 and the lower dome 150 are connected to and inserted into the inner wall of the process chamber 110, in which the wafer 102 and the platen 112 are between the upper dome 148 and the lower dome 150. In some embodiments, the first group of the heat sources 130 emits the radiation toward the wafer through a central portion of the upper dome 148, and the second group of the heat sources 130 emits the radiation toward the wafer through a bottom portion of the lower dome 150. In some embodiments, the central portion of the upper dome 148 and the bottom portion of the lower dome 150 are formed from an optically transparent material, such as quartz, so as to direct the radiation from the heat sources 130 without absorption. In some embodiments, the upper dome 148 has a peripheral portion around a circumference of the central portion and the lower dome 150 has a peripheral portion around a circumference of the bottom portion, and the peripheral portions of the upper dome 148 and the lower dome 150 are inserted into the inner wall of the process chamber 110.

Reference is made back to FIGS. 4A and 4B. Since the heat source 130 is rotatable, the lamp 134 can be oriented in different orientations. Explained in a different way, the illumination area of the radiation on the wafer 102 is adjustable. Accordingly, the distribution of the radiation on the wafer 102 is adjustable as well. Furthermore, in some embodiments, the temperature detector 122 provides detected temperature information to the controller 124, and the controller 124 drives the movable devices 140 to put the corresponding heat sources 130 in a rotational motion, so as to adjust the distribution of the radiation on the wafer 102.

Figure 4D:
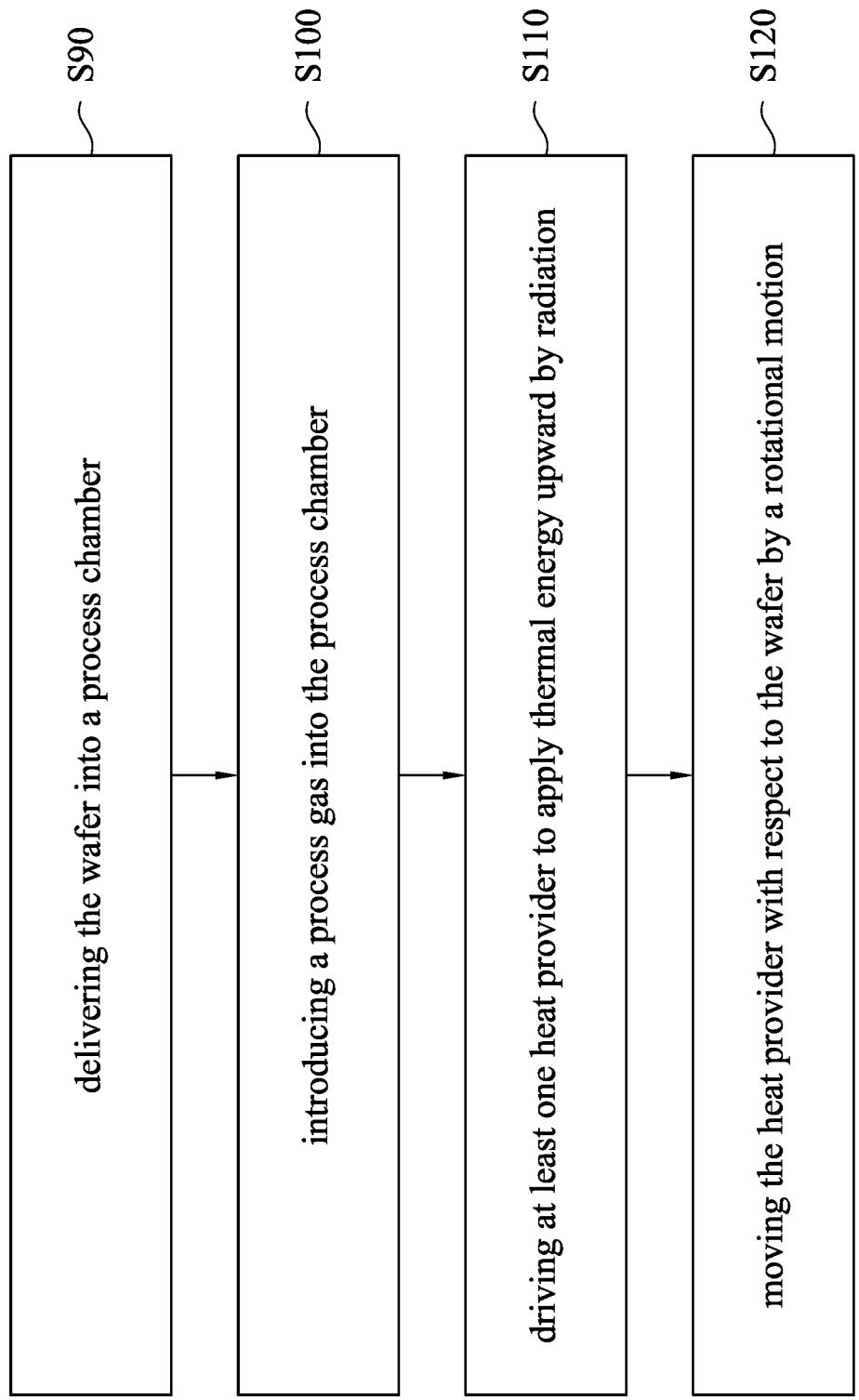
FIG. 4D is a flowchart of operations of a method for processing a wafer in accordance with some embodiments of the present disclosure.

Reference is made to FIG. 4D, which shows a flowchart of operations S90-S120 of a method for processing a wafer in accordance with some embodiments of the present disclosure. In some embodiments, the apparatus 100C is used for heating a wafer, so as to perform an epitaxial process on the wafer. The method begins with operation S90 that delivering the wafer into a process chamber. The method continues with operation S100 that introducing a process gas into the process chamber. The method continues with operation S110 that driving at least one heat provider to apply thermal energy upward by radiation. The method continues with operation S120 that moving the heat provider with respect to the wafer by a rotational motion. In some embodiments, in the operation S120, the rotational motion of the heat provider is caused by at least one movable device. In some embodiments, in the operation S120, the heat provider can be oriented in different orientations, such that the illumination area of the radiation on the wafer is adjustable.

Figure 5:
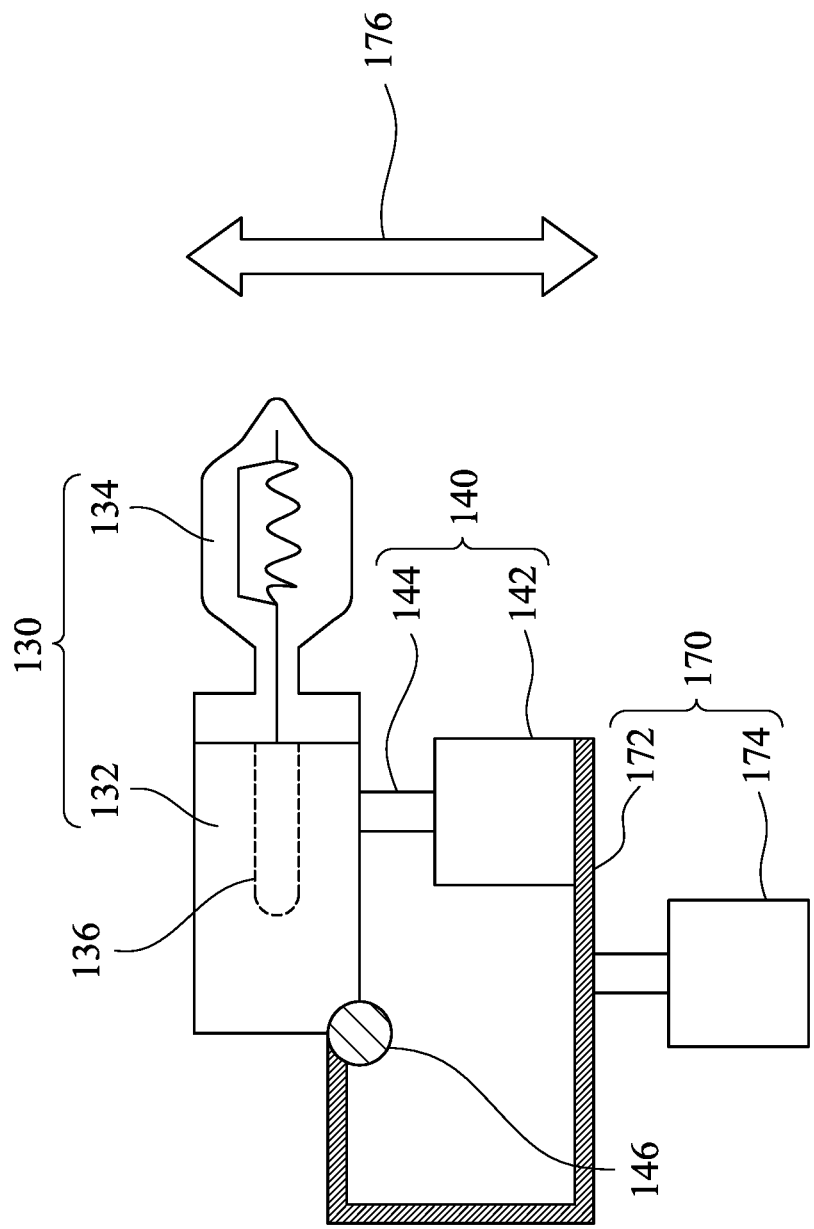
FIG. 5 is a side view of a combination of a heat source, a movable device, and a level-adjusting device of an apparatus for processing a wafer in accordance with some embodiments of the present disclosure.

Reference is made to FIG. 5, in which FIG. 5 is a side view of a combination of a heat source 130, a movable device 140, and a level-adjusting device 170 in accordance with some embodiments of the present disclosure. As illustrated in FIG. 5, the apparatus further includes a level-adjusting device 170 supporting the heat source 130 and the movable device 140. The level-adjusting device 170 includes a base 172 and a lifting device 174. The lifting device 174 is disposed on the frame 128 (see FIG. 4B) and is movable with respect to the platen 112 (see FIG. 4B). The lifting device 174 may be a step motor having an output rod contacting the base 172. The base 172 is in contact with the movable device 140 and the heat source 130. The lifting device 174 can move the base 172 along a line 176. That is, the base 172 can move with respect to the platen 112 (see FIG. 4B), and therefore the heat source 130 and the movable device 140 can move with respect to the platen 112 (see FIG. 4B) as well. With the level-adjusting device 170, the heat source 130 is able to move up and down, such that a vertical height of the heat source 130 is adjustable. Accordingly, the thermal flux received by a wafer from the heat source 130 is adjustable as well.

As described above, the apparatus is configure to perform the thermal process on the wafer and includes the heat sources and the movable devices in the process chamber. The movable device is in contact with and connected to the heat source and configured to put the heat source in the motion. As the heat sources are putted in the motion, the thermal flux received by the wafer or the distribution of the radiation on the wafer is varied, such that the raising speed of temperature of the wafer is controllable and adjustable.

According to various embodiments of the present disclosure, a method comprises delivering a wafer into a process chamber, applying a thermal energy to the wafer by a heat source, and moving the heat source substantially along a longitudinal direction of the heat source with respect to the wafer.

According to various embodiments of the present disclosure, a method comprises delivering a wafer into a process chamber, applying thermal energy to the wafer by a heat source, and rotating the heat source using a spherical joint.

According to various embodiments of the present disclosure, an apparatus comprises a process chamber, a wafer support in the process chamber, a sleeve in the process chamber, and a lamp socket movably received in the sleeve.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   delivering a wafer into a process chamber;
   applying a thermal energy to the wafer by a lamp of a heat source; and
   moving the lamp of the heat source substantially along a longitudinal direction of the lamp of the heat source with respect to the wafer, wherein moving the lamp of the heat source comprises moving a movable portion that is coupled to the heat source and that is telescopically and movably received in a stationary portion.

2. The method of claim 1, wherein applying the thermal energy to the wafer comprises enabling the heat source to emit radiation toward the wafer, the wafer being above the heat source.

3. The method of claim 1, wherein applying the thermal energy to the wafer comprises enabling the heat source to emit radiation toward the wafer, the wafer being below the heat source.

4. The method of claim 1, wherein moving the lamp of the heat source further comprises moving the lamp of the heat source upward to increase a temperature of the wafer.

5. The method of claim 1, wherein moving the lamp of the heat source further comprises moving the lamp of the heat source downward to increase a temperature of the wafer.

6. A method, comprising:
   delivering a wafer into a process chamber;
   applying thermal energy to the wafer by a heat source;
   rotating the heat source using a spherical joint, wherein the spherical joint includes a ball socket and a connecting element that has a first straight portion and a ball-shaped end directly connected to the first straight portion and in the ball socket; and
   moving the heat source substantially along a longitudinal direction of the heat source.

7. The method of claim 6, wherein rotating the heat source is such that the heat source is slanted from a vertical direction.

8. The method of claim 6, wherein rotating the heat source comprises swinging a movable device coupled to the heat source.

9. The method of claim 6, wherein moving the heat source comprises moving a movable portion that is coupled to the heat source and the spherical joint and that is telescopically and movably received in a stationary portion.

10. A method, comprising:
    delivering a wafer into a process chamber;
    applying a thermal energy to the wafer by a heat source, wherein the heat source is connected to a pivot and a lift pin; and
    linearly moving the lift pin to cause the heat source to rotate with respect to the pivot, such that the linear motion of the lift pin directly results in the rotational motion of the heat source.

11. The method of claim 10, further comprising:
    linearly moving the heat source toward or away from the wafer.

12. The method of claim 10, further comprising:
 detecting a temperature at a location adjacent to the wafer.

13. The method of claim 12, wherein linearly moving the lift pin to put the heat source in the rotational motion is performed based on the detected temperature.

14. The method of claim 10, wherein linearly moving the lift pin to put the heat source in the rotational motion comprises rotating the heat source along a curved line.

15. The method of claim 10, further comprising:
 directing radiation from the heat source through a dome between the wafer and the heat source.

16. The method of claim 10, wherein applying the thermal energy to the wafer comprises enabling the heat source to emit radiation upward.

17. The method of claim 10, wherein applying the thermal energy to the wafer comprises enabling the heat source to emit radiation downward.

18. The method of claim 6, wherein the connecting element further has a second straight portion directly connected to the first straight portion and the first and second straight portions together form a T-shaped cross-section.

19. The method of claim 10, wherein the pivot extends in a first direction and the lift pin extends in a second direction transverse to the first direction.

20. The method of claim 10, wherein the heat source has opposite first and second ends, the pivot is connected to the first end of the heat source, and the lift pin abuts the heat source at a position between the first and second ends of the heat source.

\* \* \* \* \*